(12) United States Patent
Ishibashi et al.

(10) Patent No.: US 8,575,650 B2
(45) Date of Patent: Nov. 5, 2013

(54) AVALANCHE PHOTODIODE

(75) Inventors: Tadao Ishibashi, Yokohama (JP); Seigo Ando, Yokohama (JP); Yoshifumi Muramoto, Atsugi (JP); Fumito Nakajima, Atsugi (JP); Haruki Yokoyama, Atsugi (JP)

(73) Assignees: NTT Electronics Corporation, Tokyo (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 13/133,990

(22) PCT Filed: Dec. 11, 2009

(86) PCT No.: PCT/JP2009/070783
§ 371 (c)(1),
(2), (4) Date: Jun. 10, 2011

(87) PCT Pub. No.: WO2010/071088
PCT Pub. Date: Jun. 24, 2010

(65) Prior Publication Data
US 2011/0241150 A1    Oct. 6, 2011

(30) Foreign Application Priority Data
Dec. 17, 2008 (JP) .................................. 2008-321298

(51) Int. Cl.
*H01L 31/107* (2006.01)

(52) U.S. Cl.
USPC .................... 257/186; 257/438; 257/E31.124

(58) Field of Classification Search
USPC .................................. 257/186, 438, E31.124
See application file for complete search history.

(56) References Cited

U.S. PATENT DOCUMENTS 5,654,578 A * 8/1997 Watanabe ...................... 257/438
7,208,770 B2 * 4/2007 Kish et al. ........................ 257/96
(Continued)

FOREIGN PATENT DOCUMENTS

JP  08-181349   7/1996
JP  08-242016   9/1996
(Continued)

OTHER PUBLICATIONS

International Preliminary Report on Patentability dated Jun. 30, 2011 for corresponding International Patent Application No. PCT/JP2009/070783 with English translation.

(Continued)

*Primary Examiner* — Kimberly Rizkallah
*Assistant Examiner* — Alexander Belousov
(74) *Attorney, Agent, or Firm* — Ohlandt Greeley Ruggiero & Perle L.L.P.

(57) ABSTRACT

An electron injected APD with an embedded n electrode structure in which edge breakdown can be suppressed without controlling the doping profile of an n-type region of the embedded n electrode structure with high precision. The APD comprising a buffer layer with a low ionization rate is inserted between an n electrode connecting layer and an avalanche multiplication layer. Specifically, the APD is an electron injected APD in which an n electrode layer, the n electrode connecting layer, the buffer layer, the avalanche multiplication layer, an electric field control layer, a band gap gradient layer, a low-concentration light absorbing layer, a p-type light absorbing layer, and a p electrode layer are sequentially stacked, and a light absorbing portion that includes at least the low-concentration light absorbing layer and the p-type light absorbing layer forms a mesa shape.

5 Claims, 6 Drawing Sheets

(56) References Cited

U.S. PATENT DOCUMENTS

2004/0079408 A1* 4/2004 Fetzer et al. .............. 136/262
2007/0278606 A1* 12/2007 Sasagawa et al. .......... 257/432

FOREIGN PATENT DOCUMENTS

| | | |
|---|---|---|
| JP | 11-330536 | 11/1999 |
| JP | 2000-022197 | 1/2000 |
| JP | 2005-086109 | 3/2005 |
| JP | 2005-142455 | 6/2005 |
| JP | 2005-223022 | 8/2005 |
| JP | 2007-005697 | 1/2007 |
| JP | 2009-252769 | 10/2009 |

OTHER PUBLICATIONS

Y. Hirota, et al, "Reliable non-Zn diffused InP/InGaAs avalanche photodiode with buried n-Inp layer operated by electron injection mode", Electronics Letters, Oct. 14, 2004, vol. 40, No. 21, pp. 1378-1379.

International Search Report dated Mar. 9, 2010 for corresponding International Patent Application No. PCT/JP2009/070783.

* cited by examiner

AVALANCHE PHOTODIODE

BACKGROUND

1. Field of the Disclosure

The present disclosure relates to a device element structure of an electron injection-type avalanche photodiode (photodiode with avalanche multiplication function: hereinafter, simply referred to as APD) that is suitable for a ultra-high speed operation.

2. Discussion of the Background Art

The APD that functions as a Photoreceiver device with high sensitivity is widely introduced in a 10 Gb/s system and the like that uses a long wavelength range (1.5 microns). The typical APD that operates in the long wavelength range is a hole injected APD that uses InP as an avalanche multiplication layer. Almost all the hole injected APDs take a manufacturing process that defines an avalanche multiplication region by Zn heat diffusion to InP. However, it is a serious and technical problem that precise control of the Zn heat diffusion is difficult, and an element manufacturing yield is generally poor.

Meanwhile, an electron injection-type APD that is advantageous in principle, in terms of a high-speed operation and an excess noise characteristic, is known. The electron injection-type APD generally has a structure where InAlAs is used as an avalanche multiplication layer. In the electron injection-type APD, a gain-bandwidth product (GB product) is larger as compared with the hole injected APD, and receiver sensitivity is also superior.

A problem of the electron injection-type APD is that a so-called "guard ring technology" for suppressing edge breakdown around a junction does not reach to completeness in the hole injected APD. This is because it is difficult in the electron injection-type APD to form an "ion implanted guard ring structure" generally used by the hole injected APD, that is, a structure to adjust a depth distribution of acceptor ions such as Be and decrease a multiplication coefficient (increase a breakdown voltage).

For this reason, instead of the "ion injected guard ring structure," various structures are suggested. For example, a structure where InP is regrown on a side of a mesa of an absorption layer without forming an intended guard ring, a structure where a p electrode layer is formed in a part of a plane of a planar light absorbing layer and an electric field concentration part is disposed on the side of the light absorption layer, and an embedded n electrode structure are known.

FIG. 6 shows an example of an electron injection-type APD that has an embedded n electrode structure according to the related art and shows a cross-section of the embedded n electrode structure where a convex portion is provided in a part of an n electrode disposed on the side of a substrate (refer to Patent Document 1: Japanese Patent Application Laid-Open (JP-A) No. 2005-086109; Patent Document 2: JP-A No. 2007-005697; and Patent Document 4: JP-A No. H08-181349). In the APD of FIG. 6, an n electrode layer 31, an n electrode connecting layer 32, an avalanche multiplication layer 34, an electric field control layer 35, a band gap gradient layer 36, a low-concentration light absorbing layer 37a, a p-type light absorbing layer 37b, a p electrode layer 38, and a p electrode 39 are sequentially stacked, and a light absorbing portion including the low-concentration light absorbing layer 37a and the p-type light absorbing layer 37b forms a mesa shape. On the n electrode layer 31, an n electrode 40 is disposed. The n electrode connecting layer 32 includes an n-type region 32a and a region that surrounds the n-type region 32a and has a low doping concentration. The n-type region 32a is an embedded n-type region. A portion that is shown by a broken line is an electric field concentration portion 21 where an electric field is locally concentrated.

In the light absorbing portion that is obtained by combing the low-concentration light absorbing layer 37a and the p-type light absorbing layer 37b, a band width can be maximized at the same photo-sensitivity by optimizing a thickness ratio of both layers (refer to Patent Document 3: JP-A No. 2005-223022). That is, a device element where a light absorption rate at the same band width is maximized and photo-sensitivity is maximized can be designed. This structure is effective in the electron injection-type APD, but it is difficult to be effective in the hole injection-type APD.

Since the n-type region 32a is disposed on the inner side of the light absorbing portion of the mesa shape, an electric field of a peripheral portion of the light absorbing portion can be decreased, and an electric field of the side and the surface of the mesa is also decreased. For this reason, there is an advantage that the APD of FIG. 6 can confine an avalanche region therein and time degradation of the side and the surface of the mesa can be simultaneously suppressed.

Meanwhile, in the electron injection-type APD that has the embedded n electrode structure, in an operation state, the electric field tends to be concentrated (edge electric field) on corners of an outer circumferential portion of the n-type region 32a due to a convex shape of the n-type region 32a. Since the electrical flux line of the edge electric field spreads two-dimensionally, the upper portion side of the avalanche multiplication layer 34 is away from the n-type region 32a and the electric field is likely to be decreased. However, the edge electric field is concentrated on the peripheral portions of the corners of the outer circumferential portion of the n-type region 32a (electric field concentration portion 21). Since electric field dependency of an ionization rate is large, when the electric field of the electric field concentration portion 21 reaches the avalanche multiplication layer 34, the avalanche multiplication layer 34 easily causes a phenomenon of breakdown being generated with the voltage lower than the voltage of an active region of an element center portion, that is, so-called edge breakdown. If the edge breakdown occurs, a sufficiently large avalanche multiplication rate of the active region is not realized, and the difference between the breakdown voltage and the operation voltage decreases. As a result, avalanche excessive noise increases. If the thickness of the low-concentration light absorbing layer 37a increases, an influence of the edge breakdown by the electric field concentration portion 21 increases.

It is known that by controlling the doping profile of the n-type region 32a, in principle, the electric field concentration portion 21 can be suppressed from being infiltrated into the avalanche multiplication layer 34, and the edge breakdown can be suppressed (refer to Patent Document 2: JP-A No. 2007-005697).

However, when the APD is actually manufactured, various process fluctuations are generated. For this reason, it is difficult to control the doping profile of the n-type region of the embedded n electrode structure with high precision, and thus there has been a difficult problem in manufacturing an APD where the generation of edge breakdown is suppressed.

SUMMARY

Accordingly, it is an object of the present disclosure to provide an electron injection-type APD that can solve the above problem while using an embedded n electrode structure as a base, and suppress edge breakdown without highly precise control for the doping profile of an n-type region of the embedded n electrode structure.

In order to achieve the above object, in an APD according to the present disclosure, a buffer layer with a low ionization rate is inserted between an n electrode connecting layer and an avalanche multiplication layer.

Specifically, the APD according to the present disclosure forms a stack structure that includes an n electrode layer, an n electrode connecting layer, an avalanche multiplication layer, an electric field control layer, a band gap gradient layer, a low-concentration light absorbing layer, a p-type light absorbing layer, and a p electrode layer, and has a semiconductor structure in which the n electrode connecting layer has an n-type region that is disposed to be closer to the inner side than the periphery of the avalanche multiplication layer, when viewed from a stack direction. In the stack structure, a buffer layer that has an ionization rate lower than an ionization rate of the avalanche multiplication layer is inserted between the n electrode connecting layer and the avalanche multiplication layer. The region that maintains the neutral state is generated on almost an entire surface of the p-type light absorbing layer at the side of the p electrode layer. However, the region that maintains the neutral state is not generated in a specific part even at the side of the p electrode layer.

By inserting the buffer layer, the electric field concentration portion is away from the avalanche multiplication layer, even though the edge electric field is generated. Therefore, the edge breakdown can be avoided.

Therefore, the present disclosure can provide an electron injection-type APD that uses an embedded n electrode structure as a base and can suppress the edge breakdown without controlling the doping profile of an n-type region of the embedded n electrode structure with high precision.

The APD according to the present disclosure can be formed on a substrate. When the substrate side is located toward the n electrode layer, the APD forms the stack structure on a substrate in a state where the n electrode layer is located toward the substrate side, a light absorbing portion that includes the low-concentration light absorbing layer and the p-type light absorbing layer forms a mesa shape, and the n-type region of the n electrode connecting layer is disposed to be closer to the inner side than the outer circumference of the mesa shape of the light absorbing portion, when viewed from the stack direction.

Further, the substrate side can be located toward the p electrode layer. Specifically, an APD according to the present disclosure has a stack structure including an n electrode layer, an n electrode connecting layer, an avalanche multiplication layer, an electric field control layer, a band gap gradient layer, a low-concentration light absorbing layer, a p-type light absorbing layer, and a p electrode layer. In the stack structure, a buffer layer that has an ionization rate lower than an ionization rate of the avalanche multiplication layer is inserted between the n electrode connecting layer and the avalanche multiplication layer. The APD forms the stack structure on a substrate in a state where the p electrode layer is located toward the substrate side, the n electrode connecting layer and the n electrode layer form a mesa shape, and the mesa shape is disposed to be closer to the inner side than the outer circumference of the buffer layer, when viewed from a stack direction.

In the APD according to the present disclosure, the buffer layer preferably has a doping portion where impurities are doped at the side of at least the avalanche multiplication layer. If a high-concentration thin donor doping layer is provided at the side of the avalanche multiplication layer, the stepwise electric field change can be generated. By adjusting the donor doping amount to suppress the electric field from increasing due to the concentration of the electric field, ionization can be suppressed.

The APD according to the present disclosure is a semiconductor that has a composition different from a composition of each of the buffer layer and the avalanche multiplication layer, and the buffer layer can have a band gap that is wider than a band gap of the avalanche multiplication layer. Since the band gap of the buffer layer is wider, an ionization rate of the buffer layer can be relatively lowered, even though the electric field strength is the same in the buffer layer and the avalanche multiplication layer. The above methods that provide the high-concentration thin donor doping layer may be combined.

The present disclosure can provide an electron injection-type APD that uses an embedded n electrode structure as a base and can suppress edge breakdown without highly precise control for the doping profile of an n-type region of the embedded n electrode structure.

DETAILED DESCRIPTION OF THE PREFERRED EMBODIMENT

Figure 1:
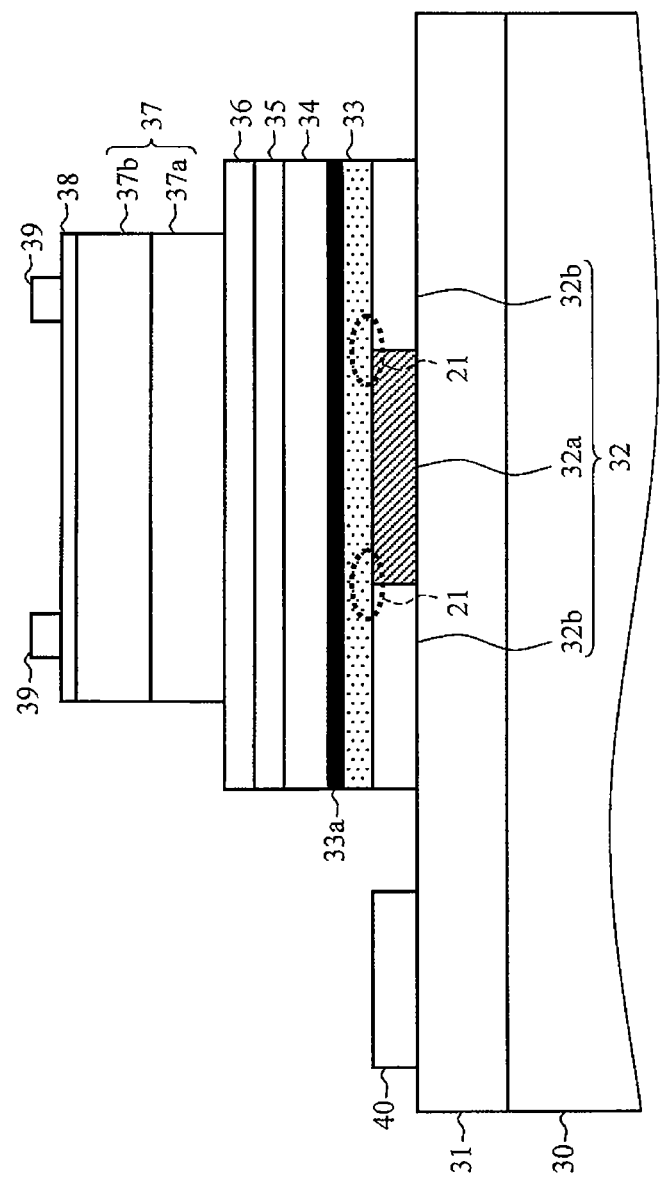
FIG. 1 is a schematic view of a device element cross-section illustrating an APD according to the present disclosure.

Hereinafter, the present disclosure will be described in detail with reference to specific embodiments. However, it should be noted that the present disclosure is not understood to be limited by the following description. In this specification and drawings, the same reference numerals denote the same components.

(First Embodiment)

FIG. 1 is a schematic view of a device element cross-section illustrating an APD according to a first embodiment. The APD of FIG. 1 is an electron injection-type APD in which an n electrode layer 31, an n electrode connecting layer 32, a buffer layer 33, an avalanche multiplication layer 34, an electric field control layer 35, a band gap gradient layer 36, a low-concentration light absorbing layer 37a, a p-type light absorbing layer 37b, and a p electrode layer 38 are sequentially stacked, and a light absorbing portion 37 including at least the low-concentration light absorbing layer 37a and the p-type light absorbing layer 37b forms a mesa shape. The APD of FIG. 1 adopts an embedded n electrode structure in which the n electrode connecting layer 32 has an n-type region 32a that is disposed to be closer to the inner side than the periphery of the avalanche multiplication layer 34 and the periphery of the mesa of the light absorbing portion 37, when viewed from a stack direction, and a low doping region 32b with a low doping concentration that is formed around the n-type region 32a, in a direction vertical to the stack direction.

The n electrode layer 31 is n-InP. The n electrode connecting layer 32 includes the n-type region 32a and the low doping region 32b that are n-InAlAs. The buffer layer 33 is InAlAS. The buffer layer 33 is formed to have a low doping concentration to decrease the change in the electric field. In this embodiment, the buffer layer 33 has a doping portion 33a where Si to be an impurity is doped into the side of the avalanche multiplication layer 34, to narrow an electric field step. The impurity concentration of the avalanche multiplication layer 34 is maintained to be low. If the impurity concentration of the avalanche multiplication layer 34 is excessively high, the electric field E of the avalanche multiplication layer 34 greatly changes, and a tunnel current is generated due to non-uniformity of the electric field, when a constant multiplication coefficient is needed. For this reason, the doping concentration of the avalanche multiplication layer 34 is maintained to be low to decrease the change in the electric field. For example, the avalanche multiplication layer 34 is InAlAs that has the low doping concentration.

The electric field control layer 35 is p-InAlAs. The band gap gradient layer 36 is InAlGaAs. The low-concentration light absorbing layer 37a is InGaAs. The p-type light absorbing layer 37b is p-type doped InGaAs. Almost an entire region of the p-type light absorbing layer 37b, except for at least a partial region at the side of the low-concentration light absorbing layer 37a, becomes a neutral state, when a portion between the p electrode layer 38 and the n electrode layer 31 is reversely biased. For example, a peripheral portion of a sidewall of the mesa of the p-type light absorbing layer 37b is a portion that does not become a neutral state at the time of being reversely biased. The side of the low-concentration light absorbing layer 37a of the p-type light absorbing layer 37b is also a portion that does not become a neutral state. The p electrode layer 38 is p-InAlGaAs.

When the APD of FIG. 1 is manufactured, first, the n electrode layer 31 and the low-concentration layer becoming the n electrode connecting layer 32 are epitaxially grown on the substrate 30, using an MO-VPE method. Then, Si ions are implanted into a portion becoming the n-type region 32a to form the n-type region with the embedded n electrode structure. After activation annealing is performed, elements from the buffer layer 33 and the doping portion 33a to the p electrode layer 38 are epitaxially grown again. Similar to the normal APD manufacturing process, in device element processing, after a double mesa is formed using chemical etching, the n electrode 40 and the p electrode 39 are deposited, and wiring separation is preformed according to necessity.

Figure 2:
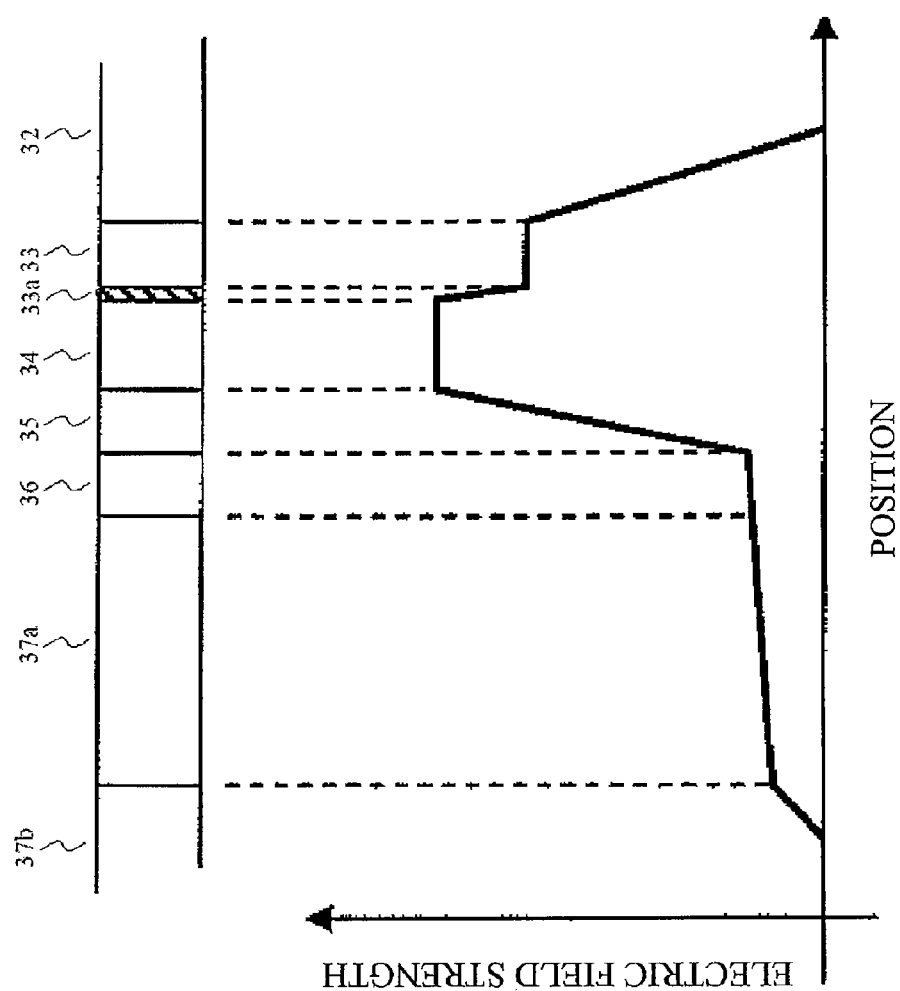
FIG. 2 is a diagram illustrating an electric field strength distribution in a center portion of an APD according to the present disclosure.

In a reversely biased operation state, each layer from the n-type region 32a of the n electrode connecting layer 32 to the low-concentration light absorbing layer 37a above the n-type region 32a is depleted, and a center portion of the element has an electric field strength distribution against a stack direction shown in FIG. 2. The stepwise electric field change from the buffer layer 33 to the avalanche multiplication layer 34 can be easily realized by adjusting the doping concentration and the thickness of the thin doping portion 33a to be formed in the buffer layer 33. For example, if the Si donor concentration is set to 1018 cm-3 and the thickness is set to 14 nm, the step amount of the electric field strength becomes 200 kV/cm, and an ionization rate of the buffer layer is sufficiently lowered. In this case, since the step amount of the electric field strength is determined by the product of donor concentration and the thickness, the donor concentration and the thickness can be appropriately determined.

Even in this structure, electric field concentration portions 21 are formed in the corners of the n-type region 32a. However, since the electric field concentration portions 21 are away from the avalanche multiplication layer 34 by inserting the buffer layer 33, the phenomenon of the breakdown being generated with the voltage lower than the voltage of the active region of the element center portion is greatly alleviated. Since the buffer layer 33 has a low ionization rate, the breakdown is difficult to be generated, even though the electric field concentration portions 21 exist. Therefore, the APD of FIG. 1 can suppress the edge breakdown from being generated.

(Second Embodiment)

Figure 3:
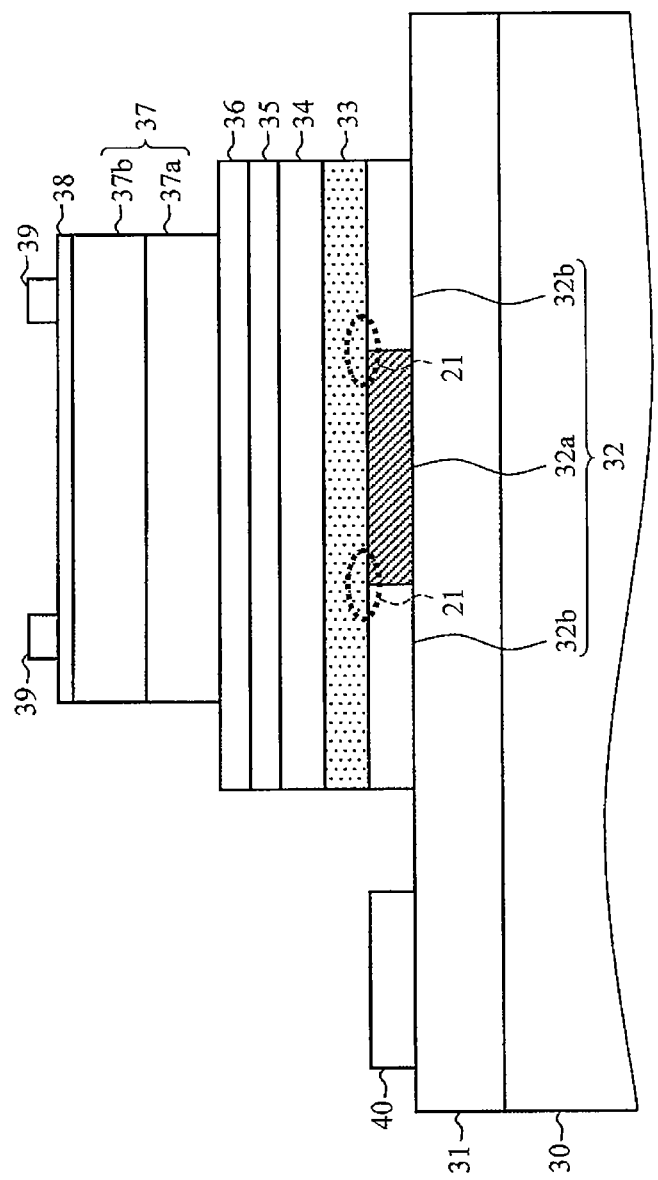
FIG. 3 is a schematic view of a device element cross-section illustrating an APD according to the present disclosure.

FIG. 3 is a schematic view of a device element cross-section illustrating an APD according to a second embodiment. The APD of FIG. 3 is also an electron injection-type APD that adopts the embedded n electrode structure, similar to the APD of FIG. 1. The difference of the APD of FIG. 3 and the APD of FIG. 1 is that the doping portion 33a does not need to be formed in the buffer layer 33 of the APD of FIG. 3, the APD is a semiconductor with a composition different from a composition of each of the buffer layer 33 and the avalanche multiplication layer 34, and the buffer layer 33 has a band gap wider than a band gap of the avalanche multiplication layer 34.

The composition of each layer from the n electrode layer 31 to the buffer layer 33 is the same as the composition of the APD of FIG. 1. The avalanche multiplication layer 34 is InAlGaAs that has a low doping concentration. The electric field control layer 35 is p-InAlGaAs. The band gap gradient layer 36 is an InAlGaAs layer where a composition is adjusted to connect the band gaps of the electric field control layer 35 and the low-concentration light absorbing layer 37a. The composition of each layer from the low-concentration absorbing layer 37a to the p electrode layer 38 is the same as the composition of the APD of FIG. 1. The APD of FIG. 3 can be manufactured by the method described in the case of FIG. 1.

Figure 4:
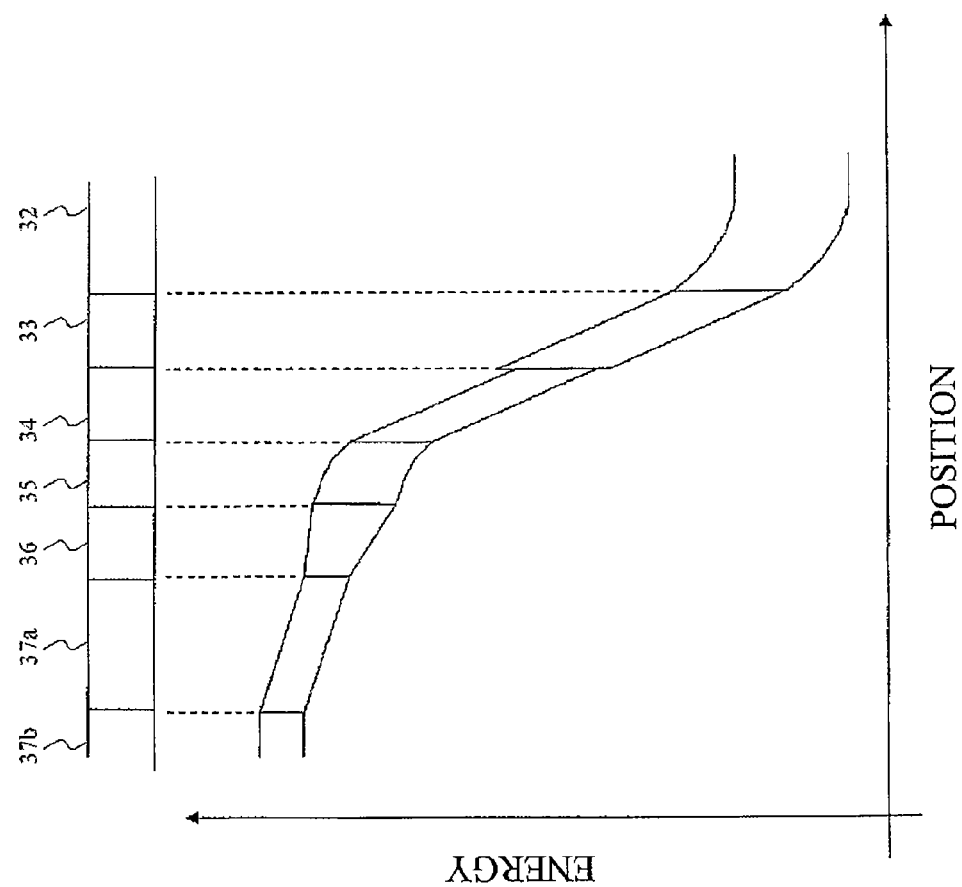
FIG. 4 is a band diagram of a center portion in an operation state of an APD according to the present disclosure.

FIG. 4 is a band diagram of a center portion in an operation state of the APD of FIG. 3. In this embodiment, the buffer layer 33 of InAlAs that has the band gap wider than the band gap of InAlGaAs is inserted between the n electrode connecting layer 32 and the avalanche multiplication layer 34. When the electric field strength is the same, in InAlAs that has the wider band gap, an ionization rate becomes relatively lower than an ionization rate of InAlGaAs. For this reason, in the APD of FIG. 3, the ionization rate of the buffer layer 33 becomes lower than the ionization rate of the avalanche multiplication layer 34.

Even in this structure, the electric field concentration portions 21 where the electric field is concentrated are formed in the corners of the n-type region 32a. However, since the electric field concentration portions 21 are away from the avalanche multiplication layer 34 by inserting the buffer layer 33, the phenomenon of the breakdown being generated with the voltage lower than the voltage of the active region of the element center portion is greatly alleviated. Since the buffer layer 33 has a low ionization rate, the breakdown is difficult to be generated, even though the electric field concentration portions 21 exist. Therefore, the APD of FIG. 3 can suppress the edge breakdown from being generated.

(Third Embodiment)

Figure 5:
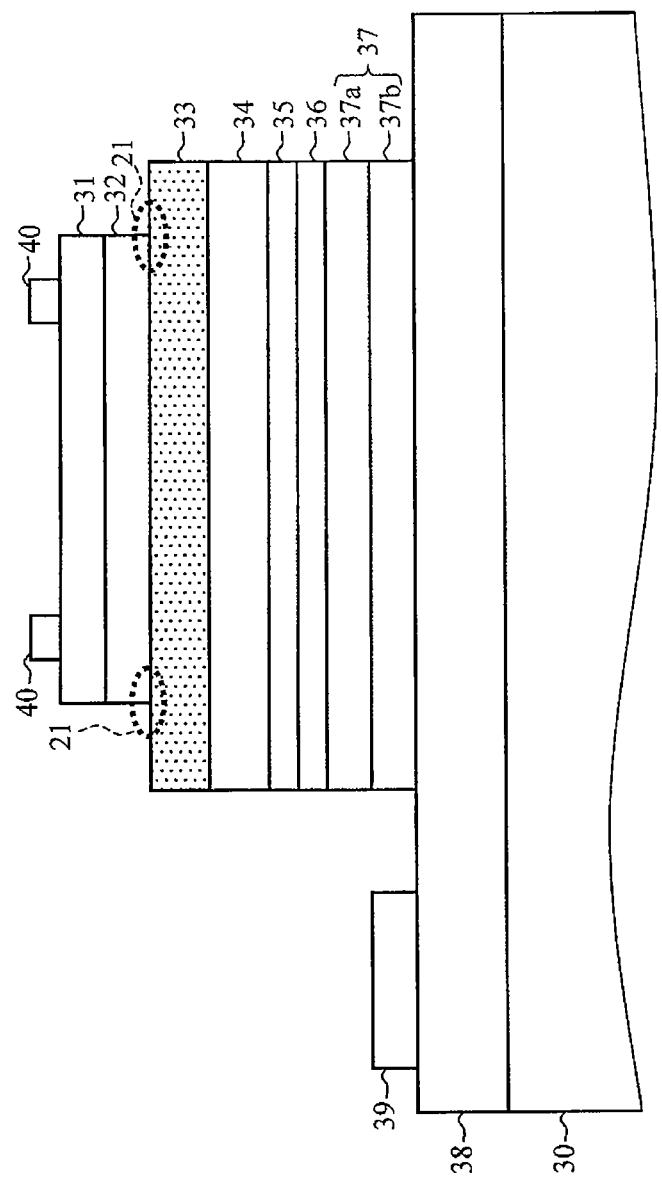
FIG. 5 is a schematic view of a device element cross-section illustrating an APD according to the present disclosure.
Figure 6:
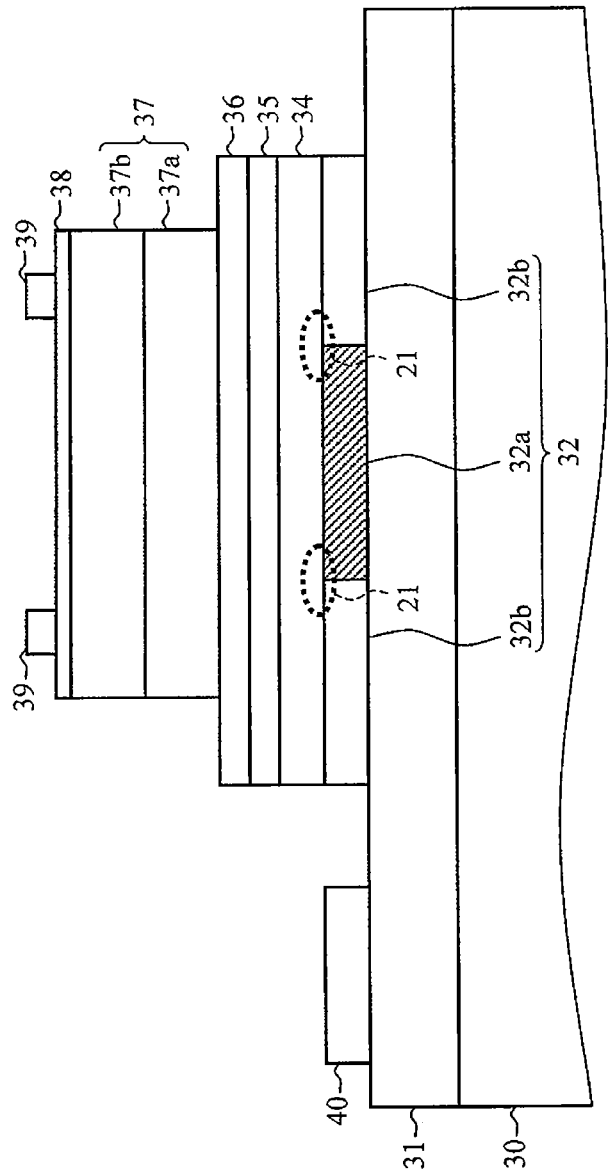
FIG. 6 is a schematic view of a device element cross-section illustrating an APD according to the related art.

FIG. 5 is a schematic view of a device element cross-section illustrating an APD according to a third embodiment. The p electrode layer 38, the p-type light absorbing layer 37b, the low-concentration light absorbing layer 37a, the band gap gradient layer 36, the electric field control layer 35, the avalanche multiplication layer 34, the buffer layer 33, the n electrode connecting layer 32, and the n electrode layer 31 are sequentially stacked on the substrate 30, and the p electrode 39 and the n electrode 40 are formed. This structure corresponds to the case where the semiconductor structure according to the second embodiment is vertically reversed. In this case, since the n electrode connecting layer 32 exists in an upper portion, instead of the substrate side, formation of the n layer by the injection of the Si ions in the cases of the first and second embodiments is not needed, and the mesa shape may be simply determined. That is, by disposing the n electrode connecting layer 32 to be closer to the inner side than the outer circumference of the lower mesa from the buffer layer 33, the same function as the APD with the embedded n electrode structure can be realized.

Even in this structure, the electric field concentration portions 21 where the electric field is concentrated are formed in the corners of the n electrode connecting layer 32 that corresponds to the n-type region 32a. However, since the electric field concentration portions 21 are away from the avalanche multiplication layer 34 by inserting the buffer layer 33, the phenomenon of the breakdown being generated with the voltage lower than the voltage of the active region of the element center portion is greatly alleviated. Since the buffer layer 33 has a low ionization rate, the breakdown is difficult to be generated, even though the electric field concentration portions 21 exist. Therefore, the APD of FIG. 5 can suppress the edge breakdown from being generated.

In the embodiments, there are described the examples of the APD that uses InAlAs and InAlGaAs as the avalanche multiplication layer and uses InGaAs as the light absorbing layer. However, the same effect can be obtained in an APD that does not restrict the kinds of semiconductor materials and uses a combination of other semiconductor materials.

What is claimed is:

1. An avalanche photodiode that forms a stack structure sequentially including an n electrode layer, an n electrode connecting layer, an avalanche multiplication layer, an electric field control layer, a band gap gradient layer, a low-concentration light absorbing layer, a p-type light absorbing layer, and a p electrode layer,
    wherein the n electrode connecting layer has an n-type region that is disposed to be closer to an inner side than an outer circumference of the avalanche multiplication layer, when viewed from a stack direction, and
    in the stack structure, a buffer layer comprising InAlAs that has an ionization rate lower than an ionization rate of the avalanche multiplication layer is inserted between the n electrode connecting layer and the avalanche multiplication layer so that there is no contact between the n electrode connecting layer and the avalanche multiplication layer, wherein the buffer layer includes a doping portion comprising InAlAs where impurities are doped at a side of the buffer layer in contact with the avalanche multiplication layer.

2. The avalanche photodiode according to claim 1, wherein the stack structure is formed on a substrate in a state where the n electrode layer is located toward the substrate side, a light absorbing portion that includes the low-concentration light absorbing layer and the p-type light absorbing layer forms a mesa shape, and the n-type region of the n electrode connecting layer is disposed to be closer to the inner side than the outer circumference of the mesa shape of the light absorbing portion, when viewed from the stack direction.

3. The avalanche photodiode according to claim 1, wherein a band gap of the buffer layer is wider than a band gap of the avalanche multiplication layer.

4. An avalanche photodiode that comprises a stack structure sequentially including an n electrode layer, an n electrode connecting layer, an avalanche multiplication layer, an electric field control layer, a band gap gradient layer, a low-concentration light absorbing layer, a p-type light absorbing layer, and a p electrode layer,
    wherein, in the stack structure, a buffer layer comprising InAlAs that has an ionization rate lower than an ionization rate of the avalanche multiplication layer is inserted between the n electrode connecting layer and the avalanche multiplication layer so that there is no contact between the n electrode connecting layer and the avalanche multiplication layer, wherein the buffer layer includes a doping portion comprising InAlAs where impurities are doped at a side of the buffer layer in contact with the avalanche multiplication layer, and
    the stack structure is formed on a substrate in a state where the p electrode layer is located toward the substrate side, the n electrode connecting layer and the n electrode layer form a mesa shape, and the mesa shape is disposed to be closer to an inner side than an the outer circumference of the buffer layer, when viewed from a stack direction.

5. The avalanche photodiode according to claim 4, wherein a band gap of the buffer layer is wider than a band gap of the avalanche multiplication layer.

* * * * *